United States Patent
Herner et al.

(10) Patent No.: US 7,265,049 B2
(45) Date of Patent: Sep. 4, 2007

(54) ULTRATHIN CHEMICALLY GROWN OXIDE FILM AS A DOPANT DIFFUSION BARRIER IN SEMICONDUCTOR DEVICES

(75) Inventors: S. Brad Herner, San Jose, CA (US); Victoria L. Eckert, Gilroy, CA (US)

(73) Assignee: SanDisk 3D LLC, Milpitas, CA (US)

( * ) Notice: Subject to any disclaimer, the term of this patent is extended or adjusted under 35 U.S.C. 154(b) by 134 days.

(21) Appl. No.: 11/215,951

(22) Filed: Aug. 31, 2005

(65) Prior Publication Data

US 2006/0006495 A1     Jan. 12, 2006

Related U.S. Application Data (63) Continuation-in-part of application No. 11/015,824, filed on Dec. 17, 2004, which is a continuation-in-part of application No. 10/955,549, filed on Sep. 29, 2004, which is a continuation-in-part of application No. 10/855,784, filed on May 26, 2004, now Pat. No. 6,952,030, which is a continuation of application No. 10/326,470, filed on Dec. 19, 2002, now abandoned.

(51) Int. Cl.
    *H01L 21/44* (2006.01)

(52) U.S. Cl. .................. 438/653; 438/643; 438/652; 438/654; 438/E21.261

(58) Field of Classification Search ........ 438/624–627, 438/642–644, 652–654
See application file for complete search history.

(56) References Cited

U.S. PATENT DOCUMENTS 5,792,569 A * 8/1998 Sun et al. .................. 428/815

OTHER PUBLICATIONS

Asuha, T. , et al., "Ultrathin silicon dioxide layers with a low leakage current density formed by chemical oxidation of Si", *Applied Physics Letters*, vol. 81, No. 18, (Oct. 28, 2002), 3410-3412.

Ellis, K A., et al., "Phosphorus Diffusion in Silicon Oxide and Oxynitride Gate Dielectrics", *Electrochem. Sol. St. Lett. 2*, (1999), 516-518.

Hamada, T., et al., "Thin Inter-Polyoxide Films for Flash Memories Grown at Low Temperature (400° ) by Oxygen Radicals", *IEEE Elect. Dev. Lett.* vol. 22, No. 9, (Sep. 2001), 423-425.

Malhotra, Vinod et al., "An Electrothermal Model of Memory Switching in Vertical Polycrystalline Silicon Structures", *IEEE Transactions on Electron Devices*, vol. 35, 9, (Sep. 1988), 1514-1523.

(Continued)

*Primary Examiner*—Dung A. Le
(74) *Attorney, Agent, or Firm*—Dugan & Dugan, PC (57) ABSTRACT

The invention is a chemically grown oxide layer which prevents dopant diffusion between semiconductor layers. The chemically grown oxide layer may be so thin that it does not form a barrier to electrical conduction, and thus may be formed within active devices such as diodes or bipolar transistors. Such a chemically grown oxide film is advantageously used to prevent dopant diffusion in a vertically oriented polysilicon diode formed in a monolithic three dimensional memory array.

20 Claims, 5 Drawing Sheets

OTHER PUBLICATIONS

Nutzel, J F., et al., "Comparison of P and Sb as n-dopants for Si molecular beam epitaxy", *J. Appl. Phys.* 78 (2), (Jul. 15, 1995), 937-940.

Park, B., et al., "Study of contact resistance in in-situ phosphorus layer doped Si deposition process", *Electrochemical Society Proceedings 99-31*(1999), 34-45.

Raider, S I., et al., "Abstract: Stoichiometry of SiO2/Si interfacial regions: I. Ultrathin oxide films", *J. Vac. Sci. Tech.* vol. 13, No. 1, (Jan./Feb. 1976), 58.

Singh, D V., et al., "Abrupt phosphorus profiles in Si: Effects of temperature and substitutional carbon on phosphorus autodoping", *Journal of the Electrochemical Society*, 150, (2003), G553-G556.

\* cited by examiner

ULTRATHIN CHEMICALLY GROWN OXIDE FILM AS A DOPANT DIFFUSION BARRIER IN SEMICONDUCTOR DEVICES

RELATED APPLICATIONS

This application is a continuation-in-part of Herner et al., U.S. patent application Ser. No. 11/015,824, "Nonvolatile Memory Cell Comprising a Reduced Height Vertical Diode," filed Dec. 17, 2004 and hereinafter the '824 application, which is a continuation-in-part of Herner, U.S. patent application Ser. No. 10/955,549, "Nonvolatile Memory Cell Without a Dielectric Antifuse Having High- and Low-Impedance States," filed Sep. 29, 2004, hereinafter the '549 application; which is a continuation-in-part of Herner et al., U.S. patent application Ser. No. 10/855,784, now U.S. Pat. No. 6,952,030, "A High-Density Three-Dimensional Memory Cell," filed May 26, 2004; which is a continuation of Herner et al., U.S. patent application Ser. No. 10/326470, "An Improved Method for Making High-Density Nonvolatile Memory," filed Dec. 19, 2002 (since abandoned) and hereinafter the '470 application, all assigned to the assignee of the present invention and hereby incorporated by reference in their entirety.

BACKGROUND OF THE INVENTION

The invention relates to an ultrathin chemically grown oxide layer which serves to prevent dopant diffusion between semiconductor layers.

P-type and n-type dopants are added to semiconductor material, notably silicon, to enhance conductivity. Most semiconductor devices require adjacent regions of the device to have different dopant characteristics: One region is to be heavily doped while an adjacent region is undoped or lightly doped, for example; or a heavily doped p-type region may be adjacent to a heavily doped n-type region.

Dopants do not reliably remain where they've been placed through implantation or in situ doping, however. Dopants tend to diffuse, and, particularly in smaller devices, sharp transitions in doping profiles can be difficult to maintain.

Barriers can be used to prevent dopant diffusion, but in general such barriers will significantly change the electrical properties of the device. A thick oxide layer, for example, would form an unwanted dielectric barrier.

There is a need, therefore, for a method to prevent or inhibit dopant diffusion between semiconductor regions in a semiconductor device without disrupting the electrical function of the device.

SUMMARY OF THE PREFERRED EMBODIMENTS

The present invention is defined by the following claims, and nothing in this section should be taken as a limitation on those claims. In general, the invention is directed to a chemically grown oxide film that serves as a dopant diffusion barrier.

A first aspect of the invention provides for a semiconductor device in an integrated circuit comprising: a first semiconductor layer; a chemically grown oxide grown on the first semiconductor layer, wherein the chemically grown oxide comprises nitrogen and is no more than about 7 angstroms thick; and a second semiconductor layer in immediate contact with the chemically grown oxide, wherein the first semiconductor layer or the second semiconductor layer is doped with a first conductivity-enhancing dopant, and wherein, after fabrication of the integrated circuit is complete, a concentration of the first conductivity-enhancing dopant is at least ten times higher in one of the first semiconductor or the second semiconductor layer than in the other of the first semiconductor layer or the second semiconductor layer.

Another aspect of the invention provides for a method for forming a semiconductor device, the method comprising: forming a first semiconductor layer; growing a chemically grown oxide on the first semiconductor layer in a liquid ambient; forming a second semiconductor layer directly on the chemically grown oxide, wherein the first semiconductor layer or the second semiconductor layer is doped with a first conductivity-enhancing dopant; and subjecting the first semiconductor layer, the chemically grown oxide layer, and the second semiconductor layer to a temperature exceeding about 700 degrees C., wherein the chemically grown oxide inhibits diffusion of the first conductivity-enhancing dopant between the first and second semiconductor layers.

A preferred embodiment of the invention provides for a method for forming a nonvolatile memory cell, the method comprising: depositing a first semiconductor layer above a substrate; growing a chemically grown oxide on the first semiconductor layer in a liquid ambient; depositing a second semiconductor layer above the chemically grown oxide; and forming a vertically oriented diode comprising the first semiconductor layer, the chemically grown oxide, and the second semiconductor layer, wherein the nonvolatile memory cell comprises the vertically oriented diode.

Another preferred embodiment of the invention provides for a method to form a monolithic three dimensional memory array, the method comprising: i) forming a first memory level above a substrate, the first memory level formed by a method comprising: a) forming a first plurality of substantially parallel conductors extending in a first direction; b) depositing a first semiconductor layer above the first conductors; c) growing a first chemically grown oxide on the first semiconductor layer in a liquid ambient; d) depositing a second semiconductor layer above the first chemically grown oxide; f) patterning and etching the first semiconductor layer and the second semiconductor layer to form a first plurality of pillars; and e) forming a second plurality of substantially parallel conductors above the first pillars, the second conductors extending in a second direction different from the first direction, each of the first pillars disposed between one of the first conductors and one of the second conductors; and ii) monolithically forming a second memory level above the first memory level.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
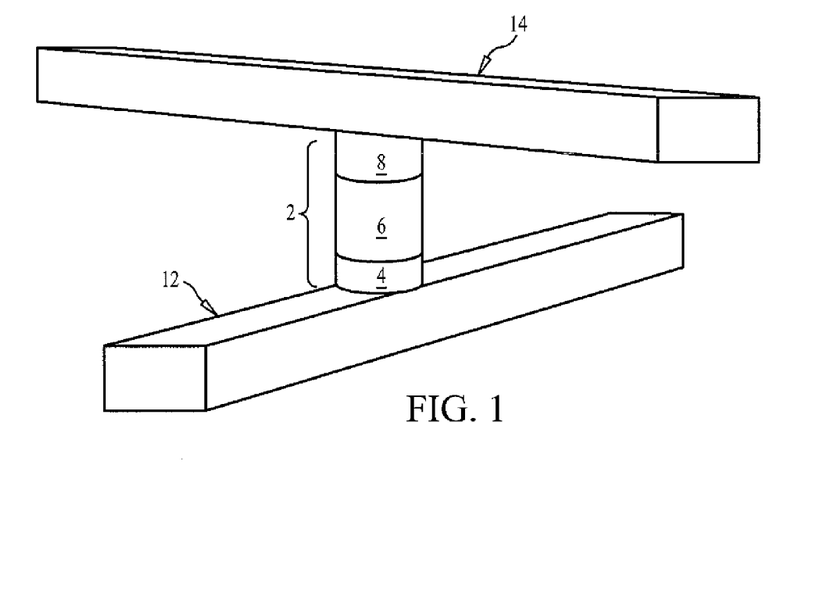
FIG. 1 is a perspective view showing a vertical polysilicon diode that may advantageously be formed having a chemically grown oxide film according to an embodiment of the invention.

Semiconductor devices are doped with p-type and n-type dopants to enhance conductivity. Most semiconductor devices require sharp transitions in dopant profiles. For example, FIG. 1 shows a vertically oriented p-i-n diode 2, formed of polycrystalline silicon (in this discussion, polycrystalline silicon will be referred to as polysilicon.) The diode is formed between bottom conductor 12 and top conductor 14. Bottom region 4 is heavily doped with an n-type dopant, such as phosphorus or arsenic, middle region 6 is intrinsic polysilicon, which is not intentionally doped, and top region 8 is heavily doped with a p-type dopant such as boron or $BCl_3$. (Many other semiconductor devices, including p-n diodes, Zener diodes, thyristors, bipolar transistors, etc., include regions having different doping characteristics. The p-i-n diode 2 of FIG. 1 is presented as an example.) The difference in doping characteristics between these different regions must be maintained for the device to function.

Dopants can be introduced into semiconductor material by several methods, including ion implantation or diffusion from a nearby dopant source. If the semiconductor material is deposited, it can be doped in situ, by flowing a gas that will provide the dopant during deposition, so that dopant atoms are incorporated into the semiconductor material as it is deposited.

Dopants may diffuse, however, especially when provided with thermal energy. Additionally, most n-type dopants, such as phosphorus and arsenic, have a strong preference to be located on the surface of deposited silicon, rather than buried. Referring to FIG. 1, heavily doped n-type region 4 can be formed by flowing $SiH_4$, a typical precursor gas to deposit silicon, along with $PH_3$, which will provide phosphorus. To form intrinsic region 6, the flow of $PH_3$ is stopped, while $SiH_4$ flow continues. The silicon of region 6 is deposited without dopant, but phosphorus from region 4, seeking the surface, diffuses into region 6 during deposition. A significant thickness of silicon must be deposited to guarantee that a sufficient thickness of region 6 is deposited which includes no phosphorus. Unwanted dopant diffusion from heavily doped region 4 to intrinsic region 6 makes it difficult to form a sharp junction between these regions, and may force the overall height of the diode 2 to be more than desired.

Not only n-type dopants having strong affinity for the film surface are prone to unwanted diffusion. Elevated temperature processing will cause most dopants to diffuse, and boron, the most popular p-type dopant, diffuses rapidly in silicon.

Inclusion of a barrier material could serve to impede dopant diffusion. In general, though, a non-semiconductor material between semiconductor layers has been impractical because such a barrier would disrupt the electrical performance of the device. Silicon, the most commonly used semiconductor material, can be oxidized to form a high-quality oxide, silicon dioxide. A thermally grown silicon dioxide layer will prevent or slow diffusion of dopants, but will also act as an unwanted dielectric barrier. As the silicon dioxide layer is made thinner, it allows more current flow, but becomes a less effective barrier to diffusion. Also, the temperatures required to perform thermal oxidation will promote unwanted diffusion elsewhere on the wafer. Conductive barrier materials, like titanium nitride, disrupt the electrical performance of the device.

Aspects of the present invention provide for semiconductor devices that include a chemically grown oxide (CGO) film that serves as a highly effective dopant diffusion barrier, even when formed so thin that it does not act as a dielectric barrier and thus can be formed between layers in an active device. In preferred embodiments this CGO film is grown by immersing a layer of silicon or a silicon-rich alloy in a chemical wet bath. This is a low-temperature growth technique which will not increase the overall thermal budget. Limiting exposure to high-temperature processes reduces undesirable side effects, such as dopant diffusion elsewhere in the device, or peeling of, for example, metal or silicon dioxide layers or elements caused by differential expansion and contraction of unlike materials when heated and cooled.

Figure 2A:
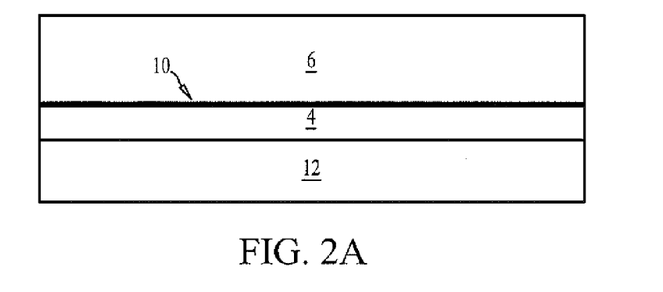
FIGS. 2a and 2b are cross-sectional views showing stages in formation of a vertical polysilicon diode formed having a chemically grown oxide film within the device according to a preferred embodiment of the invention.

Such a CGO film can be formed in the vertically oriented polysilicon diode of FIG. 1. The diode is preferably formed above a conventional monocrystalline silicon wafer, though other substrates may be used. Turning to FIG. 2a, bottom conductor 12 is formed, dielectric is deposited between adjacent conductors, and a planarization step removes overfill of dielectric, forming a planar surface and exposing the top of conductor 12. Conductor 12 is shown in cross-section extending left-to-right across the page. The first layer 4 of silicon heavily doped with an n-type dopant, such as phosphorus, is deposited on the planarized surface. After deposition of layer 4, the wafer is removed from the chamber and dipped in a conventional HF solution to remove any native oxide. Next the wafer is preferably immersed in a chemical wet bath, preferably comprising $H_2O_2$ and a chemical that will contribute nitrogen, for example $NH_4OH$. A dip of about 5 minutes at about 55 degrees C., for example, will form a very thin CGO film 10, about 4.7 angstroms thick. (The thickness of CGO film 10 is exaggerated. If it were shown to scale, CGO film 10 would not be visible.) Next the wafer is returned to the chamber, and the remaining thickness of silicon 6 is deposited.

Figure 2B:
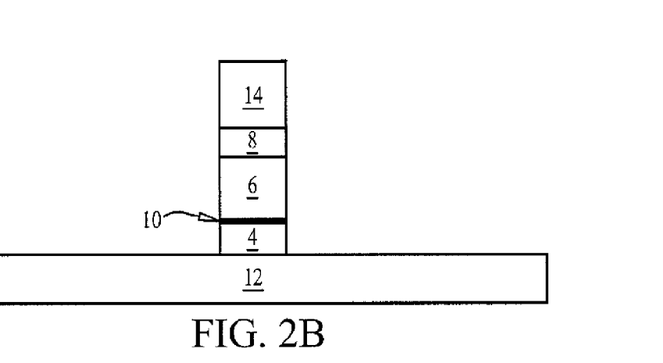

Turning to FIG. 2b, a pattern and etch step is performed next, forming the pillar-shaped diode 2. As will be appreciated by those skilled in the art, it is usual to form a large number of such pillars in a single patterning step. Gaps between the diodes 2 are filled with dielectric fill (not shown); a planarization step, for example by chemical mechanical polishing (CMP) removes the overfill of dielectric to expose the tops of diodes 2. Top heavily doped p-type region 8 is formed by ion implantation. After implantation, the top conductor 14 (shown in cross-section, extending out of the page) will be formed.

It has been found that very thin CGO film 10 will prevent or inhibit diffusion of phosphorus from heavily doped n-type region 4 into intrinsic region 6. A CGO film grown as described includes a small amount, for example about 0.4 atomic percent, of nitrogen. The amount of included nitrogen may vary, for example from about 0.2 atomic percent to about 2 atomic percent or more. Inclusion of a small percentage of nitrogen in oxide films has been shown to impede dopant diffusion. Without wishing to be bound by any particular theory, it is believed that the incorporated nitrogen in the CGO film of the present invention gives the film its property as a superior barrier to dopant diffusion when compared with silicon dioxide films without nitrogen.

This film is formed extremely thin, and thus does not form a dielectric barrier that will interfere with the function of p-i-n diode 2. Despite the presence of CGO film 10, heavily doped n-type region 4 is in effective electrical contact with intrinsic region 6.

Many variations can be imagined. The CGO film of the present invention can be formed between intrinsic region 6 and top heavily doped p-type region 8 instead or as well. Top heavily doped p-type region 10 can be doped by ion implantation, as described, or in situ doped. Bottom region 4 could be doped by ion implantation or some other method. The polarity of doped regions 2 and 6 could be reversed.

To summarize, diode 2 is an example of a semiconductor device in an integrated circuit comprising: a first semiconductor layer; a chemically grown oxide grown on the first semiconductor layer, wherein the chemically grown oxide comprises nitrogen and is no more than about 7 angstroms thick; and a second semiconductor layer in immediate contact with the chemically grown oxide, wherein the first semiconductor layer or the second semiconductor layer is doped with a first conductivity-enhancing dopant, and wherein, after fabrication of the integrated circuit is complete, a concentration of the first conductivity-enhancing dopant is at least ten times higher in one of the first semiconductor or the second semiconductor layer than in the other of the first semiconductor layer or the second semiconductor layer. The difference in dopant concentration in the first and second semiconductor layers can be much greater, for example about 100 or 1000 times.

For example, adjacent to CGO film 10, heavily doped layer 4 can have a dopant concentration between about $1 \times 10^{19}$ and about $3 \times 10^{21}$ atoms/cm$^3$, while adjacent to heavily doped CGO film 10, intrinsic layer 6 has a dopant concentration between about $1 \times 10^{15}$ and about $1 \times 10^{18}$ atoms/cm$^3$. These differences in dopant concentration are maintained even after exposure to elevated temperatures, for example 500, 600, or 700 degrees C. or greater. Temperature may be elevated during various processes, for example during an anneal step performed to crystallize the semiconductor material.

In the example given, the first and second semiconductor layers are diode portions. In this embodiment, one layer is heavily doped while the other is substantially undoped; in other embodiments (p-n diodes, for example) the first semiconductor layer can be doped with a dopant of a first conductivity type, while the second semiconductor layer is doped with a dopant of a second conductivity type, the second type opposite the first type. In any case, the CGO film serves to prevent diffusion of dopants between the first and second semiconductor layers. The first and second semiconductor layers are in electrical contact.

The '549 application describes a monolithic three dimensional memory array including vertically oriented p-i-n diodes like diode 2 of FIG. 1. As formed, the polysilicon of the p-i-n diode is in a high-resistance state. Application of a programming voltage permanently changes the nature of the polysilicon, rendering it low-resistance. It is believed the change is caused by an increase in the degree of order in the polysilicon, as described more fully in Herner et al., Ser. No. 11/148,530, "Nonvolatile Memory Cell Operating by Increasing Order in Polycrystalline Semiconductor Material," filed Jun. 8, 2005 and hereby incorporated by reference. This change in resistance is stable and readily detectable, and thus can record a data state, allowing the device to operate as a memory cell. A first memory level is formed above the substrate, and additional memory levels may be formed above it.

As described in the '824 application, it may be advantageous to reduce the height of the p-i-n diode. A shorter diode requires a lower programming voltage and decreases the aspect ratio of the gaps between adjacent diodes. Very high-aspect ratio gaps are difficult to fill without voids. A thickness of at least 600 angstroms is preferred for the intrinsic region to reduce current leakage in reverse bias of the diode. Inclusion of a CGO film in such a diode according to aspects of the present invention will allow for sharper transitions in the dopant profile, and thus reduce overall diode height.

This technique is particularly useful in a monolithic three dimensional memory array. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

The problem of dopant diffusion is aggravated in fabrication of a monolithic three dimensional memory array, since devices formed in the first memory level are exposed to the thermal processing required to create the memory levels above it, which are necessarily formed after it. Thus the CGO film of the present invention is advantageously used in such an array.

Figure 3:
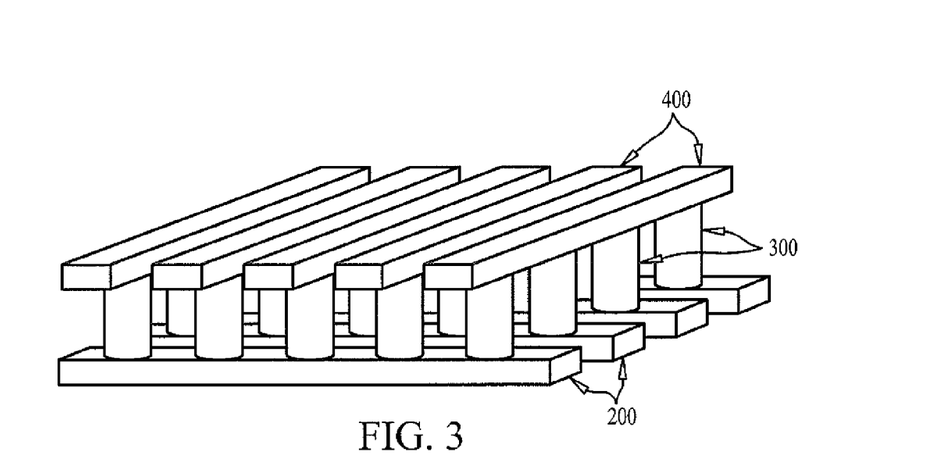
FIG. 3 is a perspective view of a memory level of memory cells like those shown in FIG. 2b.

FIG. 3 shows a memory level of exemplary memory cells formed according to an embodiment of the present invention, including bottom conductors 200, pillars 300 (each pillar 300 comprising a diode), and top conductors 400. Fabrication of such a memory level, including a CGO film formed according to embodiments of the present invention within each diode (not shown) will be described in detail. More detailed information regarding fabrication of a similar memory level is provided in the '470, '549, and '824 applications, previously incorporated. More information on fabrication of related memories is provided in Herner et al., U.S. patent application Ser. No. 11/125,606, "High-Density Nonvolatile Memory Array Fabricated at Low Temperature Comprising Semiconductor Diodes," filed May 9, 2005; Herner et al., U.S. patent application Ser. No. 10/954,577, "Junction Diode Comprising Varying Semiconductor Compositions," filed Sep. 29, 2004; and Herner et al., U.S. patent application Ser. No. 11/125939, "Rewriteable Memory Cell Comprising a Diode and a Resistance-Switching Material," filed May 9, 2005 and hereinafter the '939 application, all owned by the assignee of the present invention and hereby incorporated by reference. To avoid obscuring the invention, not all of this detail will be included in this description, but no teaching of these or other incorporated patents and applications is intended to be excluded. It will be understood that this example is non-limiting, and that these details can be modified, omitted, or augmented while the results fall within the scope of the invention.

Fabrication

Fabrication of a single memory level will be described in detail. Additional memory levels can be stacked, each monolithically formed above the one below it.

Figure 4A:
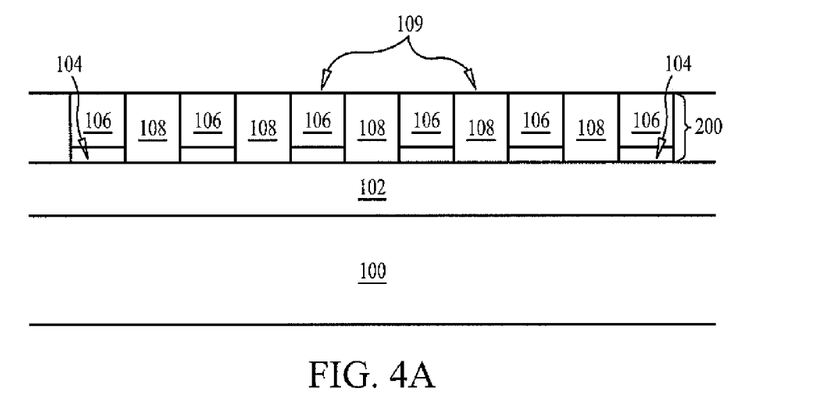
FIGS. 4a-4c are cross-sectional views showing stages of fabrication of a first memory level of a monolithic three dimensional memory array formed according to a preferred embodiment of the present invention.

Turning to FIG. 4a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate and insulator. An adhesion layer 104 may be included between the insulating layer 102 and the conducting layer 106 to help the conducting layer 106 adhere. If the overlying conducting layer is tungsten, titanium nitride is preferred as adhesion layer 104.

The next layer to be deposited is conducting layer 106. Conducting layer 106 can comprise any conducting material known in the art, such as tungsten, or other materials, including tantalum, titanium, copper, cobalt, or alloys thereof.

Once all the layers that will form the conductor rails have been deposited, the layers will be patterned and etched using any suitable masking and etching process to form substantially parallel, substantially coplanar conductors 200, shown in FIG. 4a in cross-section. In one embodiment, photoresist is deposited, patterned by photolithography and the layers etched, and then the photoresist removed using standard process techniques. Conductors 200 could be formed by a Damascene method instead.

Next a dielectric material 108 is deposited over and between conductor rails 200. Dielectric material 108 can be any known electrically insulating material, such as silicon oxide, silicon nitride, or silicon oxynitride. In a preferred embodiment, silicon doxide is used as dielectric material 108.

Finally, excess dielectric material 108 on top of conductor rails 200 is removed, exposing the tops of conductor rails 200 separated by dielectric material 108, and leaving a substantially planar surface 109. The resulting structure is shown in FIG. 4a. This removal of dielectric overfill to form planar surface 109 can be performed by any process known in the art, such as chemical mechanical planarization (CMP) or etchback. An etchback technique that may advantageously be used is described in Raghuram et al., U.S. application Ser. No. 10/883417, "Nonselective Unpatterned Etchback to Expose Buried Patterned Features," filed Jun. 30, 2004 and hereby incorporated by reference. At this stage, a plurality of substantially parallel first conductors have been formed at a first height above substrate 100.

Figure 4B:
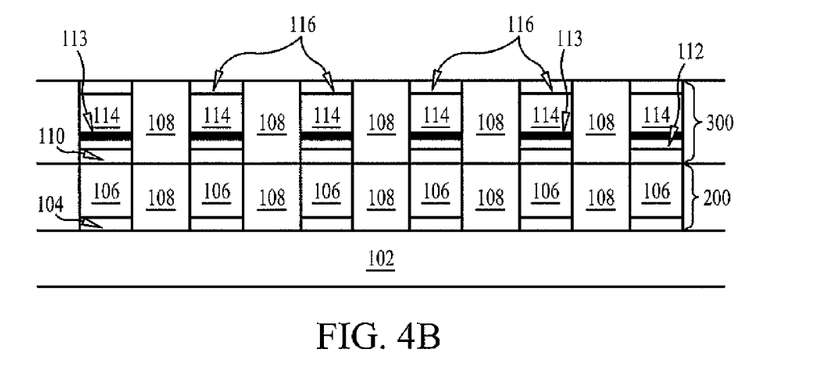

Next, turning to FIG. 4b, vertical pillars will be formed above completed conductor rails 200. (To save space substrate 100 is not shown in FIG. 4b; its presence will be assumed.) Preferably a barrier layer 110 is deposited as the first layer after planarization of the conductor rails. Any suitable material can be used in the barrier layer, including tungsten nitride, tantalum nitride, titanium nitride, or combinations of these materials. In a preferred embodiment, titanium nitride is used as the barrier layer. Where the barrier layer is titanium nitride, it can be deposited in the same manner as the adhesion layer described earlier.

Next semiconductor material that will be patterned into pillars is deposited. The semiconductor material can be silicon, germanium, a silicon-germanium alloy, or other suitable semiconductors or compounds. For simplicity, this description will refer to the semiconductor material as silicon, but it will be understood that the skilled practitioner may select any of these other suitable materials instead.

Figure 5A:
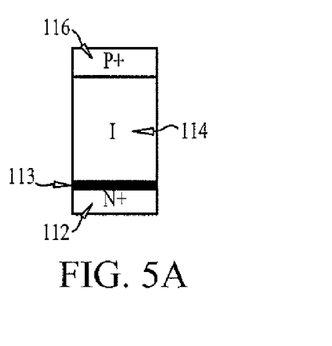
FIGS. 5a and 5b are cross-sectional views of vertical diodes formed according to embodiments of the present invention.

In preferred embodiments, the pillar comprises a semiconductor junction diode. Turning to FIG. 5a, a preferred junction diode has a bottom heavily doped region 112, intrinsic region 114, and top heavily doped region 116. The conductivity type of bottom region 112 and top region 116 are opposite: Either region 112 is p-type while region 116 is n-type, or region 112 is n-type while region 116 is p-type. Middle region 114 is intrinsic, or not intentionally doped, though in some embodiments it may be lightly doped. An undoped region will never be perfectly electrically neutral, and will always have defects or contaminants that cause it to behave as if slightly n-doped or p-doped.

Figure 5B:
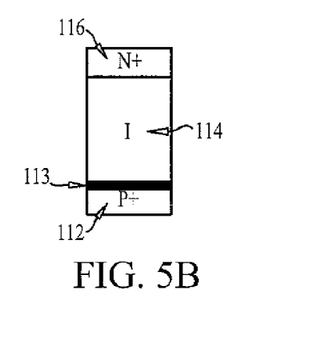

In FIG. 5a, and in the exemplary array, bottom region 112 will be n-type while top region 116 is p-type. It will be understood that these conductivity types could be reversed, as in FIG. 5b. A CGO film 113 is interposed between regions 112 and 114.

To form the diode of FIG. 5a, returning to FIG. 4b, bottom heavily doped region 112 can be formed by any deposition and doping method known in the art. The silicon can be deposited and then doped, but is preferably doped in situ by flowing a donor gas providing n-type dopant atoms, for example phosphorus, during deposition of the silicon. Heavily doped region 112 is preferably between about 100 and about 800 angstroms thick, preferably about 200 angstroms thick. Layer 112 is preferably at least 80 atomic percent silicon. It is preferred that layer 112 be high in silicon, so that the CGO film to be formed is predominantly silicon dioxide, rather than germanium oxide.

Next the wafers are removed from the chamber. An HF dip may be performed to remove any native oxide that has formed on the silicon. The silicon is then exposed to a solution containing $H_2O_2$ and a component that will provide nitrogen. For example, the wafer may be immersed in a bath containing $NH_4OH$, $H_2O_2$, and $H_2O$, in equal amounts, for at least one minute, for example for about five minutes or longer. The bath is preferably heated to a temperature between about 25 and about 180 degrees C., for example about 55 degrees C. This step will cause growth of thin CGO film 113. This layer will be very thin, preferably less than about 10 angstroms thick, preferably between about 4 and about 7 angstroms thick, for example about 4.7 angstroms thick, and may or may not be continuous. In order to be shown in FIG. 4b, CGO film 113 is necessarily depicted with its thickness exaggerated relative to the other layers.

Undoped silicon is to be deposited next to form intrinsic layer 114. It will be recalled that the previous deposition was of heavily doped n-type silicon to form layer 112. During this deposition, heavily doped silicon was deposited not only on the wafers, but on chamber walls and other surfaces. During deposition of intrinsic silicon layer 114, doped silicon on chamber surfaces from the previous deposition may provide unwanted dopant to the intrinsic silicon; such unintentional doping is called autodoping. To avoid autodoping, either the chamber can be cleaned before the deposition of intrinsic layer 114 or a thin undoped layer can be deposited in an empty chamber, effectively sealing in the earlier-deposited dopants. The method of depositing a passivation layer to prevent autodoping is described in Herner et al., U.S. Pat. No. 6,635,556, "Method of Preventing Autodoping," hereby incorporated by reference.

Figure 6A:
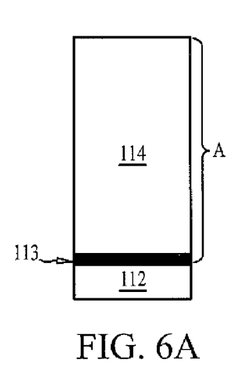
FIGS. 6a-6c are cross-sectional views illustrating loss of semiconductor thickness during formation of a diode formed according to an embodiment of the present invention.
Figure 6B:
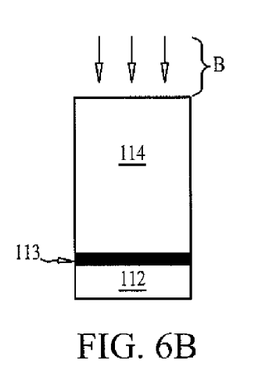
Figure 6C:
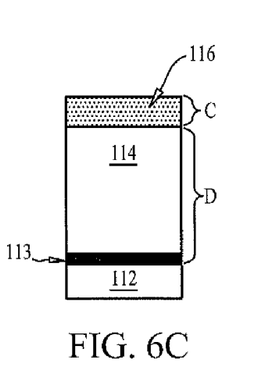

When the wafer is returned to the chamber, intrinsic layer 114 is deposited on CGO film 113. Intrinsic layer 114 can be formed by any method known in the art. Layer 114 can be silicon, germanium, or any alloy of silicon or germanium. In a preferred embodiment heavily doped p-type layer 116 will be formed by ion implantation. Turning to FIG. 6a, intrinsic layer 114 has a deposited thickness A. As shown in FIG. 6b, an upcoming planarization step will remove a thickness B, and, in FIG. 6c, ion implantation to form region 116 will cause a thickness C to be heavily doped. In the finished device intrinsic layer 114 should have thickness D. Thus the thickness A to be deposited is the sum of the ultimate desired thickness D of the intrinsic region 114, the thickness C of heavily doped p-type region 116 to be formed by implantation, and thickness B to be lost during planarization. In the finished device, intrinsic region 114 is preferably between about 600 and about 2000 angstroms, for example about 1600 angstroms. Heavily doped p-type layer 116 is between about 100 and about 1000 angstroms, preferably about 200 angstroms. The amount lost during planarization will most likely be between about 400 and about 800 angstroms, depending on the planarization method used. The thickness to be deposited undoped in this step, then, is between about 1100 and about 3800 angstrom, preferably about 2600 angstroms.

Note that despite the presence of CGO film 113, silicon layer 112 and semiconductor layer 114 are in electrical contact.

Returning to FIG. 4b, semiconductor layers 114 and 112 just deposited, along with underlying barrier layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728436, "Photomask Features with Interior Nonprinting Window Using Alternating Phase Shifting," filed Dec. 5, 2003; or Chen, U.S. application Ser. No. 10/815312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between the semiconductor pillars 300, filling the gaps between them. Dielectric material 108 can be any known electrically insulating material, such as silicon oxide, silicon nitride, or silicon oxynitride. In a preferred embodiment, silicon dioxide is used as the insulating material.

Next the dielectric material on top of the pillars 300 is removed, exposing the tops of pillars 300 separated by dielectric material 108, and leaving a substantially planar surface. This removal of dielectric overfill can be performed by any process known in the art, such as CMP or etchback.

After CMP or etchback, ion implantation is performed, forming heavily doped p-type top region 116. The p-type dopant is preferably boron or $BCL_3$. The resulting structure is shown in FIG. 4b.

As described earlier, the resistivity of the semiconductor material of the diode detectably and permanently changes when subjected to a programming voltage. In some embodiments, a dielectric rupture antifuse, which is intact before programming and is ruptured during programming, may be included in the cell to increase the difference between current flow observed when a read voltage is applied to a programmed vs. an unprogrammed cell.

Figure 4C:
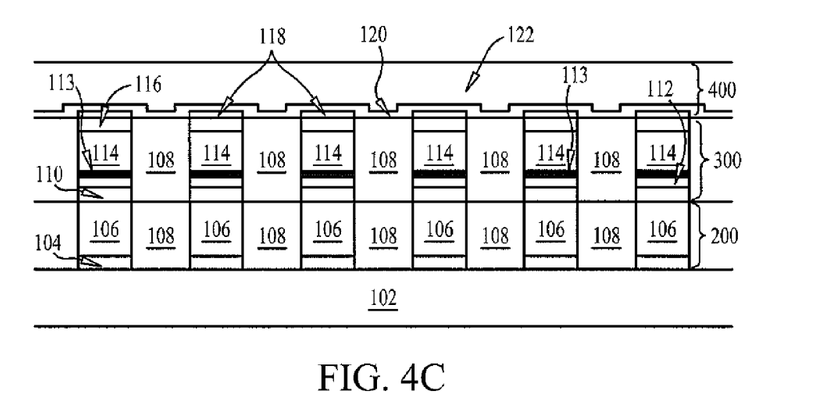

Turning to FIG. 4c, if optional dielectric rupture antifuse 118 is included, it can be formed by any appropriate method, including thermal oxidation of a portion of heavily doped p-type region 116. Silicon dioxide is a high-quality oxide, while germanium oxide is a very poor quality oxide, and is water-soluble. So long as the semiconductor material at the top of heavily doped p-type layer 116 is at least about 80 atomic percent silicon, this oxide can be thermally grown, as shown in FIG. 4c, and will be predominantly high-quality silicon dioxide. Alternatively, this layer can be deposited instead, and may be any appropriate dielectric material. For example, a layer of $Al_2O_3$ can be deposited at about 150 degrees C. Other materials may be used. Dielectric rupture antifuse 118 is preferably between about 20 and about 80 angstroms thick, preferably about 50 angstroms thick. In other embodiments, dielectric rupture antifuse 118 may be omitted.

Top conductors 400 can be formed in the same manner as bottom conductors 200, for example by depositing adhesion layer 120, preferably of titanium nitride, and conductive layer 122, preferably of tungsten. Conductive layer 122 and adhesion layer 120 are then patterned and etched using any suitable masking and etching technique to form substantially parallel, substantially coplanar conductors 400, shown in FIG. 4c extending left-to-right across the page. In a preferred embodiment, photoresist is deposited, patterned by photolithography and the layers etched, and then the photoresist removed using standard process techniques.

Next a dielectric material (not shown) is deposited over and between conductor rails 400. The dielectric material can be any known electrically insulating material, such as silicon oxide, silicon nitride, or silicon oxynitride. In a preferred embodiment, silicon oxide is used as this dielectric material.

Note that in the device just described, CGO film 113 does not behave as a dielectric rupture antifuse. With applied voltage, a dielectric rupture antifuse initially prevents current flow, building up capacitance. When capacitance becomes too high, the dielectric rupture antifuse suffers dielectric breakdown, and a permanent conductive path is formed through the antifuse. CGO film 113 does not form a dielectric barrier; it is too thin and too conductive to build up sufficient capacitance to cause dielectric breakdown.

Formation of a first memory level has been described. Additional memory levels can be formed above this first memory level. In some embodiments, conductors can be shared between memory levels; i.e. top conductor 400 would serve as the bottom conductor of the next memory level. In other embodiments, an interlevel dielectric (not shown) is formed above the first memory level of FIG. 4c, its surface planarized, and construction of a second memory level begins on this planarized interlevel dielectric, with no shared conductors.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

The detailed example given described a method for forming a semiconductor device, the method comprising: forming a first semiconductor layer; growing a chemically grown oxide on the first semiconductor layer in a liquid ambient; forming a second semiconductor layer directly on the chemically grown oxide, wherein the first semiconductor layer or the second semiconductor layer is doped with a first conductivity-enhancing dopant. In embodiments of the present invention, during formation of a monolithic three dimensional memory array, the first semiconductor layer, the chemically grown oxide layer, and the second semiconductor layer may be subjected to a temperature exceeding about 700 degrees C. The chemically grown oxide inhibits diffusion of the first conductivity-enhancing dopant between the first and second semiconductor layers. During programming and read of this device, a current will be passed between the first and second semiconductor layers.

A nonvolatile memory cell is formed by a method comprising: depositing a first semiconductor layer above a substrate; growing a chemically grown oxide on the first semiconductor layer in a liquid ambient; depositing a second semiconductor layer above the chemically grown oxide; and forming a vertically oriented diode comprising the first semiconductor layer, the chemically grown oxide, and the second semiconductor layer, wherein the nonvolatile memory cell comprises the vertically oriented diode. The step of growing the chemically grown oxide comprises immersing the first semiconductor layer in a solution comprising $H_2O_2$ and a component comprising nitrogen, for example $NH_4OH$. During the growing step the temperature does not exceed about 180 degrees C.

The memory cell described includes a first conductor extending in a first direction and a second conductor extending in a second direction, the second direction different from the first direction, the diode above the first conductor, the second conductor above the diode, and the vertically oriented diode disposed between the first conductor and the second conductor. Embodiments of the memory cell may further include a resistance-switching element in series with the diode, such as an antifuse. In other embodiments, other materials, such as nickel oxide may be used as the resistance-switching material, as in the '939 application. If the resistance-switching element is an antifuse, the cell will be a one-time-programmable memory cell. If the resistance change is reversible, the cell may be a rewriteable memory cell.

Other Devices

Use of a CGO film in a vertical polysilicon p-i-n diode has been described, but it will be understood by those skilled in the art that many other devices may benefit from the dopant diffusion barrier properties of such a film.

Figure 7:
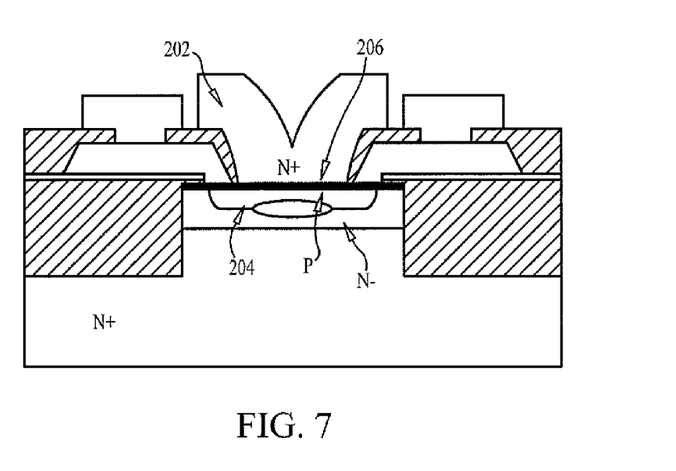
FIG. 7 is a cross-sectional view of another embodiment of the present invention.

Turning to FIG. 7, for example, a bipolar transistor includes a heavily doped emitter 202 doped with a first conductivity type dopant, typically formed in polysilicon, adjacent to base region 204 doped with a second conductivity type dopant opposite the first type. For example, in this embodiment emitter 202 is n-type while base region 204 is p-type. Polarities of other regions are as indicated. Cross-hatched sections are a dielectric material, for example silicon dioxide. Base region 204 may be formed either in a monocrystalline wafer substrate or in polysilicon. Dopant may diffuse from emitter 202 to base region 204, which will compromise device performance by shorting the device or causing higher leakage in the "off" state, but emitter 202 and base region 204 must be in electrical contact. Bipolar transistors are well known in the art; thus this device will not be described in detail.

A CGO film 206 formed according to the present invention will prevent unwanted dopant diffusion from emitter 202 to base region 204 without preventing the electrical contact required for device function. A CGO film 206 is formed as described earlier, by exposing base region 204 to a solution comprising $H_2O_2$ and a component that will provide nitrogen, before depositing emitter 202.

In another embodiment, a CGO film can also act as a dopant diffusion barrier in a CMOS transistor. For example, the CGO film can be formed with sufficient thickness to provide a dielectric barrier, or can be coupled with another film that will provide a dielectric barrier, and can act as a gate oxide or part of a gate oxide, preventing dopant diffusion from a heavily doped gate to an undoped or lightly doped channel region.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a semiconductor device, the method comprising:
    forming a first semiconductor layer;
    growing a chemically grown oxide on the first semiconductor layer in a liquid ambient;
    forming a second semiconductor layer directly on the chemically grown oxide,
    wherein the first semiconductor layer or the second semiconductor layer is doped with a first conductivity-enhancing dopant; and
    subjecting the first semiconductor layer, the chemically grown oxide layer, and the second semiconductor layer to a temperature exceeding about 700 degrees C.,
    wherein the chemically grown oxide inhibits diffusion of the first conductivity-enhancing dopant between the first and second semiconductor layers.

2. The method of claim 1 wherein the first semiconductor layer is at least 80 atomic percent silicon.

3. The method of claim 1 wherein the growing step comprises exposing the first semiconductor layer to a solution containing $H_2O_2$.

4. The method of claim 1 wherein the growing step comprises exposing the first semiconductor layer to a solution containing a component capable of providing nitrogen.

5. The method of claim 4 wherein the solution contains $NH_4OH$.

6. The method of claim 1 wherein the growing step takes place at a temperature less than about 180 degrees C.

7. The method of claim 1 wherein the first conductivity-enhancing dopant is an n-type dopant.

8. The method of claim 7 wherein the first conductivity-enhancing dopant is phosphorus.

9. The method of claim 1 wherein the first conductivity-enhancing dopant is a p-type dopant.

10. The method of claim 9 wherein the first conductivity-enhancing dopant is boron.

11. The method of claim 1 wherein the first or the second semiconductor layer is doped by in situ doping.

12. The method of claim 1 wherein the first or the second semiconductor layer is doped by ion implantation.

13. The method of claim 1 further comprising passing a current between the first and second semiconductor layers.

14. The method of claim 1 wherein the first semiconductor layer and the second semiconductor layer are portions of a diode.

15. The method of claim 14 wherein the diode is a p-i-n diode.

16. The method of claim 14 wherein the diode is a p-n diode.

17. The method of claim 1 wherein the step of forming the first semiconductor layer comprises depositing in situ doped silicon or a silicon alloy.

18. The method of claim 17 wherein the step of forming the second semiconductor layer comprises depositing undoped silicon, germanium, or a silicon-germanium alloy.

19. The method of claim 17 wherein the step of forming the second semiconductor layer comprises depositing semiconductor material doped with a second conductivity-enhancing dopant opposite the conductivity type of the first conductivity-enhancing dopant.

20. The method of claim 1 wherein the step of forming the first semiconductor layer comprises depositing undoped silicon or a silicon alloy.

* * * * *